(12) United States Patent
Yamamoto et al.

(10) Patent No.: US 10,961,670 B2
(45) Date of Patent: *Mar. 30, 2021

(54) MAGNETIC MARKER AND MAGNETIC MARKER DETECTION SYSTEM

(71) Applicant: AICHI STEEL CORPORATION, Tokai (JP)

(72) Inventors: Michiharu Yamamoto, Tokai (JP); Tomohiko Nagao, Tokai (JP); Hitoshi Aoyama, Toaki (JP)

(73) Assignee: AICHI STEEL CORPORATION, Tokai (JP)

( * ) Notice: Subject to any disclaimer, the term of this patent is extended or adjusted under 35 U.S.C. 154(b) by 149 days.

This patent is subject to a terminal disclaimer.

(21) Appl. No.: 15/763,196

(22) PCT Filed: Oct. 17, 2016

(86) PCT No.: PCT/JP2016/080728
§ 371 (c)(1),
(2) Date: Mar. 26, 2018

(87) PCT Pub. No.: WO2017/069091
PCT Pub. Date: Apr. 27, 2017

(65) Prior Publication Data
US 2018/0305874 A1 Oct. 25, 2018

(30) Foreign Application Priority Data

Oct. 19, 2015 (JP) ................................. 2015-205776

(51) Int. Cl.
*E01F 9/30* (2016.01)
*G05D 1/02* (2020.01)
(Continued)

(52) U.S. Cl.
CPC ................ *E01F 9/30* (2016.02); *G01R 33/02* (2013.01); *G01R 33/063* (2013.01);
(Continued)

(58) Field of Classification Search
CPC ................ G01D 5/2006; G01D 5/145; G01D 2201/0213; G05D 1/0259; G05D 1/0261;
(Continued)

(56) References Cited

U.S. PATENT DOCUMENTS 3,609,678 A * 9/1971 Fayling ................ G05D 1/0261
340/905
5,853,846 A 12/1998 Clark et al.
(Continued)

FOREIGN PATENT DOCUMENTS

JP 51-26590 8/1976
JP 10-280344 A 10/1998
(Continued)

OTHER PUBLICATIONS

Extended European Search Report dated Jun. 4, 2019 in Patent Application No. 16857404.4, 7 pages.

Primary Examiner — Huy Q Phan
Assistant Examiner — Dustin R Dickinson
(74) Attorney, Agent, or Firm — Oblon, McClelland, Maier & Neustadt, L.L.P.

(57) ABSTRACT

Provided are a magnetic marker and a magnetic marker detection system with a reduced magnetic force. The magnetic marker detection system (1S) in which magnetism generated from the magnetic marker (1) laid on a road surface (53) is detected by a magnetic sensor (2) attached to a vehicle's body floor (50) of a vehicle (5) is a system with the magnetic marker (1) and the magnetic sensor (2) in combination, the magnetic marker having a magnetism reach ratio Gh/Gs, which is a ratio of a magnetic flux density (Continued)

Gh at a position at a height of 250 mm with respect to a magnetic flux density Gs of a surface, being equal to or larger than 0.5% and the magnetic sensor using a magneto-impedance element including a magneto-sensitive body with impedance changing in accordance with an external magnetic field.

20 Claims, 9 Drawing Sheets

(51) Int. Cl.
- *G01R 33/02* (2006.01)
- *G08G 1/09* (2006.01)
- *G01R 33/06* (2006.01)
- *G01R 33/09* (2006.01)
- *G08G 1/042* (2006.01)
- *B62D 6/00* (2006.01)
- *B62D 15/02* (2006.01)

(52) U.S. Cl.
CPC ............ *G01R 33/098* (2013.01); *G05D 1/02* (2013.01); *G05D 1/0259* (2013.01); *G08G 1/042* (2013.01); *G08G 1/09* (2013.01); *B62D 6/00* (2013.01); *B62D 15/025* (2013.01); *B62D 15/029* (2013.01)

(58) Field of Classification Search
CPC .. G05D 1/0263; B62D 15/025; B62D 15/029; E01F 9/30
See application file for complete search history.

(56) References Cited

U.S. PATENT DOCUMENTS

| | | | | |
|---|---|---|---|---|
| 6,292,109 | B1* | 9/2001 | Murano | G08G 1/164 |
| | | | | 340/902 |
| 6,336,064 | B1* | 1/2002 | Honkura | G01C 21/26 |
| | | | | 180/167 |
| 6,378,772 | B1* | 4/2002 | Yonemura | G06K 1/125 |
| | | | | 235/384 |
| 6,468,678 | B1 | 10/2002 | Dahlin et al. | |
| 2012/0303304 | A1* | 11/2012 | Kim | G01V 15/00 |
| | | | | 702/65 |
| 2013/0027225 | A1* | 1/2013 | Siebert | G05D 1/0261 |
| | | | | 340/933 |
| 2013/0154855 | A1* | 6/2013 | Yoo | G08G 1/042 |
| | | | | 340/935 |
| 2016/0132705 | A1* | 5/2016 | Kovarik | G06K 7/10376 |
| | | | | 340/10.3 |

FOREIGN PATENT DOCUMENTS

| | | |
|---|---|---|
| JP | 2000-90387 A | 3/2000 |
| JP | 2001-125638 A | 5/2001 |
| JP | 2002-169614 A | 6/2002 |
| JP | 2003-27432 A | 1/2003 |
| JP | 2005-202478 A | 7/2005 |
| JP | 3834926 B2 | 8/2006 |
| JP | 2008-47148 A | 2/2008 |
| WO | WO 96/16231 A1 | 5/1996 |
| WO | WO 99/17079 A1 | 4/1999 |

* cited by examiner

MAGNETIC MARKER AND MAGNETIC MARKER DETECTION SYSTEM

TECHNICAL FIELD OF THE INVENTION

The present invention relates to magnetic markers laid on a road.

BACKGROUND OF THE INVENTION

Conventionally, a magnetic marker detection system for vehicles using a magnetic marker laid on a road has been known (for example, refer to Japanese Unexamined Patent Application Publication No. 2005-202478). This magnetic marker detection system is to provide various driving supports using the magnetic marker laid along a lane, such as automatic steering control and lane departure warning, for vehicles equipped with magnetic sensors.

PATENT LITERATURE

Patent Literature 1: JP 2005-202478

SUMMARY OF THE INVENTION

However, the above-described conventional magnetic marker detection system for vehicles has the following problem. That is, while the magnetic marker has to have a strong magnetic force to some extent so as to be detectable by the magnetic sensor on the vehicle attached at a high position on the order of 100 mm to 250 mm from a road surface, if the magnetic force of the magnetic marker is too strong, a metallic substance such as a nail or bolt falling on the road surface may be attracted to the magnetic marker to induce troubles such as a flat tire of a vehicle.

The present invention was made in view of the above-described conventional problem to provide a magnetic marker and magnetic marker detection system with a reduced magnetic force.

A first aspect of the present invention is directed to a magnetic marker laid on a road surface so as to be detectable by a magnetic sensor attached to a bottom surface side of a vehicle to achieve driving support control on a vehicle side for supporting driving of a driver, wherein
the magnetic marker has a surface taken as a reference height, and a magnetism reach ratio $Gh/Gs$, which is a ratio of a magnetic flux density $Gh$ at a position at a height of 250 mm with respect to a magnetic flux density $Gs$ of the surface at a position at a height of 0 mm, is equal to or larger than 0.5%.

A second aspect of the present invention is directed to a magnetic marker detection system in which magnetism generated from a magnetic marker laid on a road surface is detected by a magnetic sensor attached to a bottom surface side of a vehicle to achieve driving support control on a vehicle side, wherein
the magnetic marker is the magnetic marker according to the first aspect.

The magnetic marker according to the present invention is a road marker with the magnetism reach ratio $Gh/Gs$, which is a ratio of the magnetic flux density $Gh$ at the position at the height of 250 mm with respect to the magnetic flux density $Gs$ of the surface, being equal to or larger than 0.5%. If the magnetism reach ratio $Gh/Gs$ is equal to or larger than 0.5%, the magnetic flux density $Gs$ of the surface of the magnetic marker can be reduced to two hundred times or less with respect to the magnetic flux density $Gh$ at the position at the height of 250 mm.

As described above, the magnetic marker according to the present invention is a road marker with excellent characteristics, in which the magnetic flux density $Gs$ of the surface can be reduced with respect to the magnetic flux density $Gh$ at the position at the height of 250 mm and the magnetic force on the surface can be reduced. The magnetic marker detection system according to the present invention is a system in which by adopting the magnetic marker in which the magnetic force on the surface can be reduced as described above, a fear of the magnetic marker attracting a metallic substance is reduced.

DESCRIPTIONS OF THE PREFERRED EMBODIMENTS

In consideration of the above-ground height of the vehicle's body floor of any of various vehicles including passenger vehicles, buses, and trucks, it is required to assume an attachment height of the magnetic sensor which detects the magnetic marker according to the present invention in a range up to 250 mm from a road surface. Thus, in the present invention, a magnetism reach ratio $Gh/Gs$ is defined, which is a ratio of the magnetic flux density $Gh$ at a position at the height of 250 mm with respect to the magnetic flux density $Gs$ of the surface. The magnetic flux density may be a magnetic flux density of magnetism in a vertical direction or other directions.

As a magnetic marker according to the present invention, a plastic magnet or rubber magnet is suitably adopted. For example, if the plastic magnet or rubber magnet resistant to cracking compared with a sintered magnet or the like is adopted, a magnetic marker resistant to use for a long period of time can be provided. Also, if the magnet of this type moldable at relatively low cost with high accuracy is adopted, a high-quality magnetic marker can be provided at reduced production cost. Furthermore, for example, a flexible rubber magnet can also flexibly address asperities on a road surface at the time of construction, deformation of asperities on a road surface in operation, and so forth.

Various driving support control can be achieved on a vehicle side by laying the magnetic marker according to the present invention, including travel control, warning control, and information notification control or the like. The travel control includes, for example, automatic steering control for causing a vehicle to travel along magnetic markers laid along a lane, merge/branch control using magnetic markers laid on a merge road/branch road, and stop control for stopping the vehicle when magnetic marker laid before a stop line at an intersection or the like is detected. The warning control includes, for example, control of warning the driver of a lane departure with reference to magnetic markers laid along a lane and control of warning the driver of an excessive speed when the vehicle passes through magnetic markers laid before an intersection or the like. The information notification control includes control for notifying that the vehicle is approaching an intersection, a branch road, or a tollgate, and control for accurately notifying that the vehicle is approaching a position of an intersection where the vehicle is to turn right during navigation for route guide. The notification control may further include control for notifying information acquirable on the vehicle side by reading the arrangement of the N pole and the S pole of the magnetic markers.

In the magnetic marker of one suitable aspect of the present invention, the magnetic flux density Gh is equal to or larger than 0.5 µT (microtesla) and equal to or smaller than 20 µT. When the magnetism reach ratio Gh/Gs is equal to or larger than 0.5% and the magnetic flux density Gh is equal to and smaller than 20 µT, the magnetic flux density Gs of the surface can be reduced within 4 mT (20 µT/0.5%). For example, a magnetic sheet for office use to be attached to a whiteboard at an office, a stationery magnetic sheet to be attached to the door of a home refrigerator, and so forth have a magnetic flux density of a surface on the order of 20 mT to 40 mT. These magnetic sheets each have a weak magnetic force to the extent of being able to retain its own weight, and are not magnets which magnetically attract a metallic substance such as a nail or bolt falling on the road surface. If the magnetic marker merely having the magnetic flux density Gs of the surface of 4 mT, which is equal to or smaller than ⅕ of that of the magnetic sheet for office use, is laid on the road surface, a fear of magnetically attracting a metallic substance such as a nail or bolt falling on the road surface is very slight. Thus, troubles such as a flat tire of a vehicle due to the magnetic marker laid on the road surface hardly occur.

The magnetic flux density Gh of the magnetic marker may be equal to or larger than 0.5 µT and equal to or smaller than 10 µT. In this case, the magnetic flux density Gs of the surface can be further reduced. If the magnetism reach ratio Gh/Gs is equal to or larger than 0.5%, the magnetic flux density Gs of the surface can be reduced within 2 mT (10 µT/0.5%).

In the magnetic marker of one suitable aspect of the present invention, the magnetism reach ratio Gh/Gs is equal to or larger than 1.0%. If the magnetism reach ratio Gh/Gs is equal to or larger than 1.0%, this further enhances the operational advantage of the present invention, in which the magnetic flux density Gs of the surface can be reduced with respect to the magnetic flux density Gh required for detection.

The magnetic marker of one suitable aspect of the present invention has a diameter equal to or larger than 100 mm. The inventors have found through researches and developments over a long period of time that as the larger the diameter of the magnetic marker is, the higher the magnetism reach ratio Gh/Gs is. In particular, in a diameter range equal to or larger than 100 mm, the degree of increase of the magnetism reach ratio Gh/Gs with respect to the diameter of the magnetic marker is significant. On the other hand, if the diameter of the magnetic marker is too large, it is difficult to distinguish the magnetic marker from a magnetic source such as an iron-made lid of a manhole laid on the road, for example. The size of the magnetic marker is set preferably in consideration of the type, size, magnetic field intensity, and so forth of a magnetism generation source that is present on the road where the magnetic marker is to be laid.

A magnetic marker of a suitable aspect of the present invention has a surface to which a coating or resin mold having a waterproof and wear-resistant effect is applied. Applying a coating or resin mold to the surface can improve durability of the magnetic marker. The coating or resin mold may be applied also to a surface of the magnetic marker to be laid down, such as a back surface or outer peripheral side surface.

A magnetic marker of a suitable aspect of the present invention has a flat shape having a thickness equal to or smaller than 5 mm and can be laid on the road surface without boring a recessed accommodation hole. Any magnetic marker that can be laid without boring a recessed accommodation hole or the like in the road surface can be laid by highly-efficient laying work at low cost. Methods for fixing to the road surface include, for example, adhesive joint with a material having an adhesive function or the like and fixing by hammering a pin or the like into the road surface.

In a magnetic marker detection system of one suitable aspect of the present invention, at least one type among a magneto-impedance sensor (MI sensor), a fluxgate sensor, and a TMR sensor is used as the magnetic sensor. The magneto-impedance sensor, the fluxgate sensor, and the TMR sensor are all known as magnetic sensors that can detect magnetism with high sensitivity. A magnetic marker detection system using at least one type among these can reliably detect magnetism generated from the magnetic marker with the reduced magnetic flux density Gs of the surface combined for use.

The magneto-impedance (MI) sensor is a magnetic sensor using a magneto-impedance element including a magneto-sensitive body with its impedance changing in accordance with an external magnetic field. The magneto-impedance element (MI element) is an element which detects magnetism by using the magneto-impedance effect (MI effect), in which the depth (thickness) of the skin layer is fluctuated by the external magnetic field due to the skin effect, in which the current density of skin layer increases when a pulse current, high-frequency current, or the like flows through the magneto-sensitive body, causing the impedance of the magneto-sensitive body to change in a sensitive manner. According to the MI element using this MI effect, highly-sensitive magnetic measurements can be performed. The use of the MI element can achieve a low-cost, small-sized magnetic sensor capable of detecting feeble magnetism on the order of, for example, 0.5 µT to 10 µT. Note that as for the MI sensor using the MI element, many applications have been filed and detailed descriptions are in, for example, International Publication No. WO2005/19851, International Publication No. WO2009/119081, and Japanese Patent No. 4655247.

The magneto-sensitive body of the MI element is preferably a high-permeability alloy magnetic body. For example, a magnetic body such as a wire, a thin film, or the like made of a soft magnetic material such as a CoFeSiB-based alloy is preferable. In particular, a zero-magnetostriction amorphous wire is preferable in view of sensitivity, cost, and so forth.

For example, a change in impedance of the magneto-sensitive body when a high-frequency current or the like flows may be directly detected from the voltage between the ends of the magneto-sensitive body or may be indirectly detected via a detection coil (pickup coil) wound around the magneto-sensitive body as a change in electromotive force. If the MI element includes a detection coil, detection in a direction of magnetism can be usefully made.

The fluxgate sensor is a highly-sensitive magnetic sensor which measures magnetic intensity from a saturation timing by using the fact that the saturation timing of a core flux changes in accordance with the external magnetic field when a periodic current flows through a soft magnetic core. Note that as for the fluxgate sensor, many applications have been filed and detailed descriptions are in, for example, International Publication WO2011/155527 and Japanese Unexamined Patent Application Publication No. 2012-154786.

The TMR (Tunneling Magneto Resistive) sensor is a highly-sensitive sensor with a structure in which an insulator layer having a film thickness on the order of 1 nm is interposed between ferromagnetic layers. The TMR sensor achieves high sensitivity by using the tunneling magneto resistive (TMR) effect, in which the electric resistance of the insulator layer significantly changes in accordance with the external magnetic field when a voltage applied vertically with respect to the film surface produces a tunnel effect that permits a current flow through the insulator layer. Note that as for the TMR sensor, many applications have been filed and detailed descriptions are in, for example, International Publication WO2009/078296 and Japanese Unexamined Patent Application Publication No. 2013-242299.

For example, if the MI sensor or the like with high magnetic detection sensitivity is used, it is sufficiently possible to detect magnetism with a magnetic flux density smaller than 0.5 µT. However, in order to ensure high durability for vehicle mount while achieving high sensitivity allowing detection of subtle magnetism as described above, the cost and size of the magnetic sensor may be increased. On the other hand, if 0.5 µT can be ensured as the magnetic flux density Gh, it is possible to provide leeway to design sensitivity and so forth on a magnetic sensor side, and a small-sized, vehicle-mountable magnetic sensor with high durability can be achieved at relatively low cost.

First Embodiment

Described is an example regarding a magnetic marker detection system 1S for vehicles with combination of a magnetic marker 1 laid on a road surface of a road for vehicles and a magnetic sensor 2 attached to a bottom surface side of a vehicle. Details of the present example are described with reference to FIG. 1 to FIG. 6.

Figure 1:
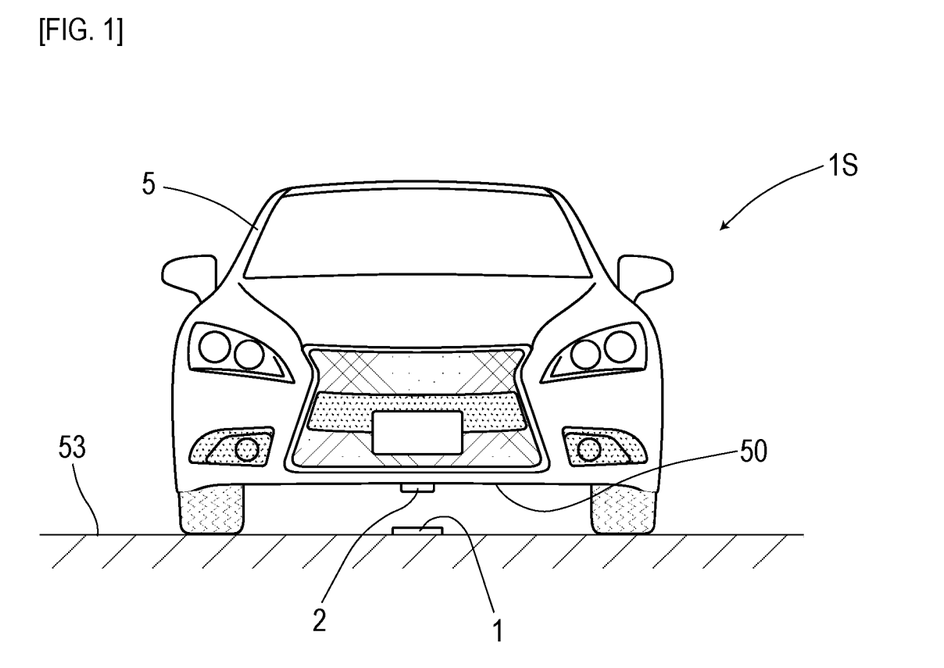
FIG. 1 is a diagram for describing a magnetic marker detection system in a first embodiment.

In the magnetic marker detection system 1S for vehicles exemplarily depicted in FIG. 1, a magnetic marker 1 is laid on a road surface 53 so as to be along the center of a lane where a vehicle 5 travels. On a vehicle 5 side, a magnetic sensor 2 is attached to a vehicle's body floor 50, which correspond to a bottom surface of the vehicle 5. An attachment height of the magnetic sensor 2 is varied depending on the vehicle type, but in a range of 100 mm to 250 mm. An output signal from the magnetic sensor 2 is inputted to an ECU, not depicted, or the like of the vehicle 5 for use in various types of control such as automatic steering control and lane departure warning to keep the lane.

Figure 2:
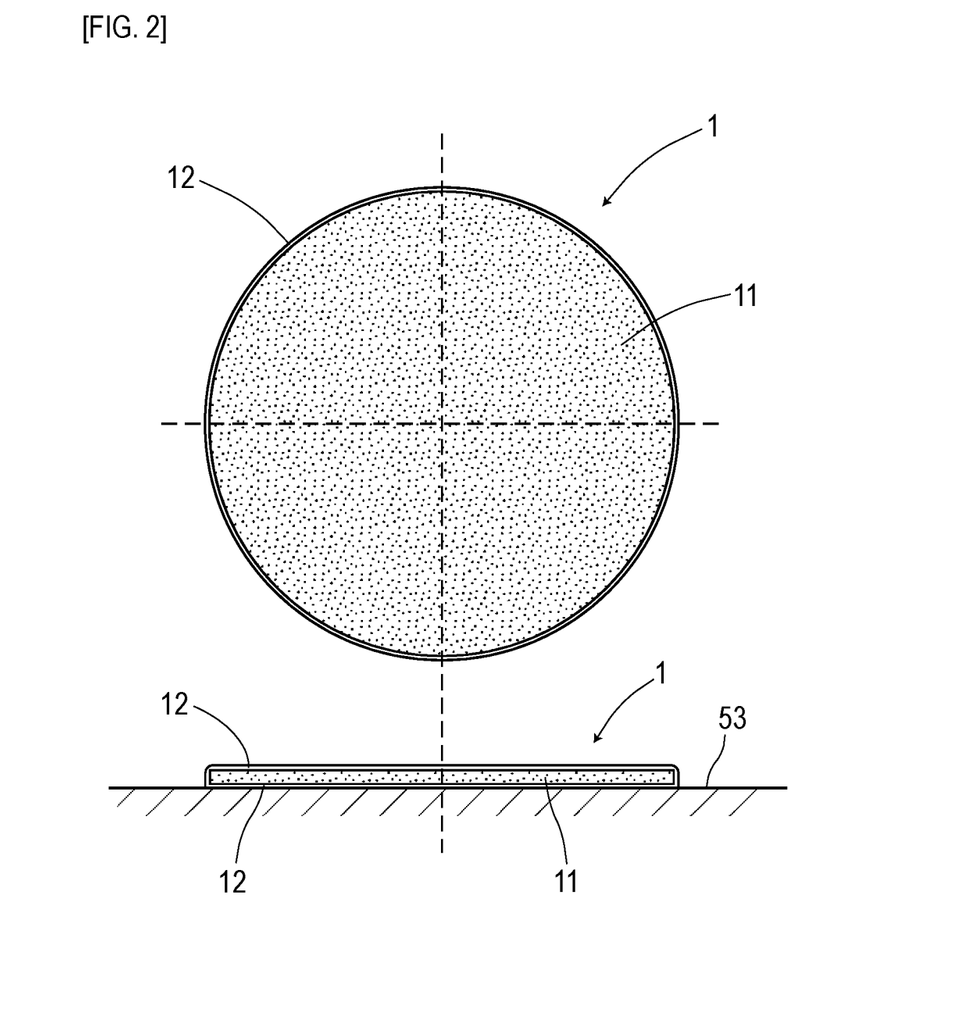
FIG. 2 depicts atop view and a side view of a magnetic marker in the first embodiment.

The magnetic marker 1 exemplarily depicted in FIG. 2 has a flat circular shape having a diameter of 100 mm and a thickness of 1.5 mm, and can be adhesively jointed onto the road surface 53. The magnetic marker 1 is formed by covering both surfaces of a flat magnetic sheet 11 having a diameter of 100 mm and a thickness of 1 mm with a resin mold 12. The magnetic sheet 11 is acquired by molding an isotropic ferrite rubber magnet having a maximum energy product (BHmax)=6.4 kJ/m$^3$ into a sheet shape. A resin mold 12 has a thickness of 0.3 mm on an upper surface side, which corresponds to a front surface of the magnetic marker 1, and a thickness of 0.2 mm on a lower surface side, which corresponds to a surface of the magnetic marker 1 to be laid down. Laying to the road surface 53 is performed by, for example, adhesive fixing with an adhesive agent. The resin mold is preferably applied also to an outer peripheral side surface of the magnetic marker 1. In this case, the diameter of the magnetic marker 1 is increased from 100 mm by approximately 0.5 mm.

The specification of the magnetic marker 1 in the present example is partially depicted in Table 1.

TABLE 1

| | |
|---|---|
| Magnet type | Ferrite rubber magnet |
| Outer diameter | φ 100 mm |
| Thickness | 1.0 mm (except resin mold) |
| Magnetic flux density Gs of the surface | 1 mT |

The magnetic flux density Gs of the surface of this magnetic marker 1 is 1 mT. For example, magnetic sheets for use as attached to a whiteboard at office, the door of a home refrigerator, or the like and magnetic sheets to be attached to a vehicle body such as stickers for newly-licensed drivers have a surface with a magnetic flux density on the order of 20 mT to 40 mT. Compared with these magnetic sheets, it can be intuitively grasped that the magnetic force generated from the magnetic marker 1 of the present example is subtle to the extent that the magnetic marker cannot function as a general magnet which attracts a metallic substance. The magnetic field distribution of this magnetic marker 1 in a vertical direction will be described further below with reference to FIG. 4.

Figure 3:
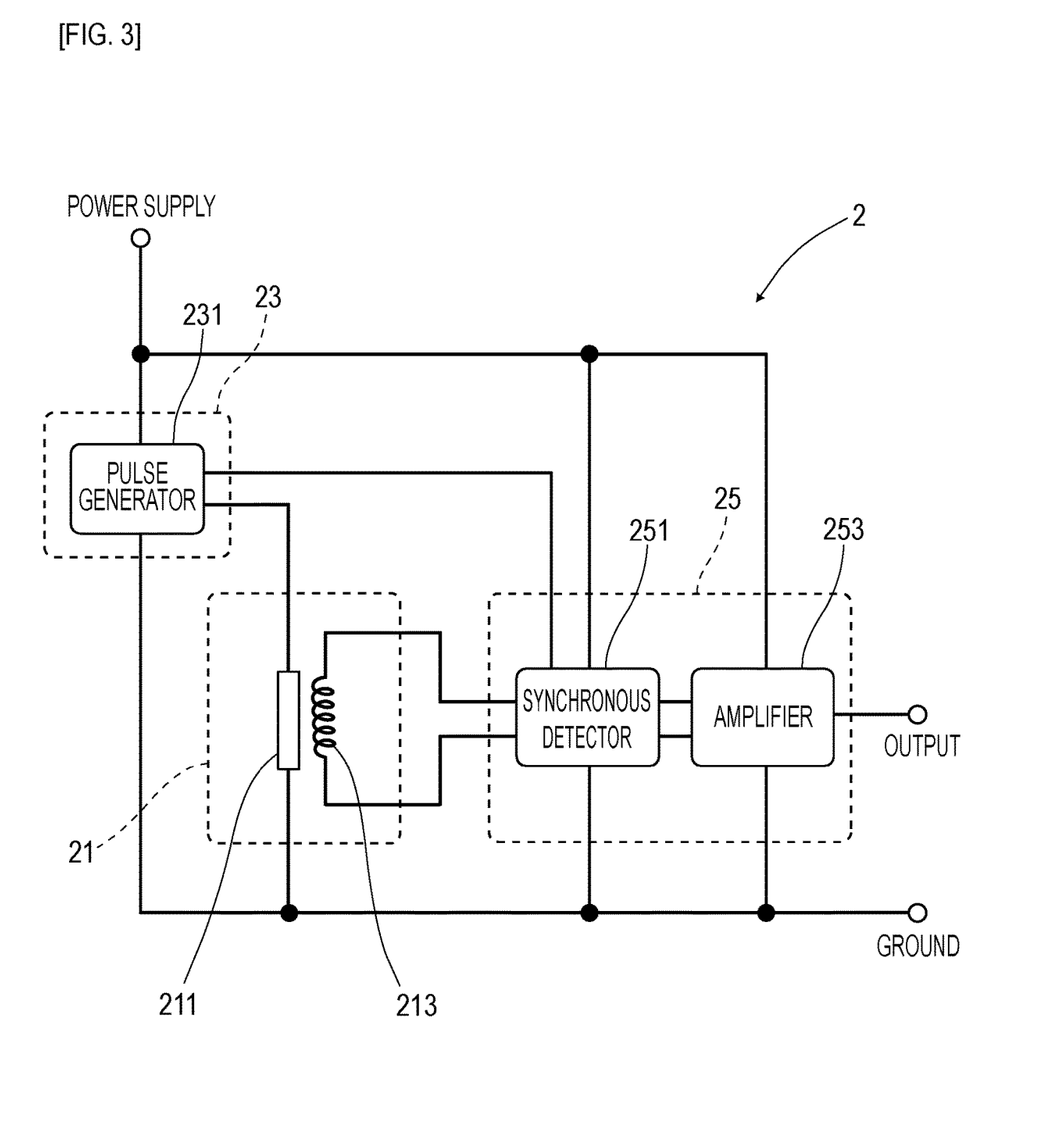
FIG. 3 is a block diagram depicting an electric structure of a magnetic sensor in the first embodiment.

As depicted in a block diagram exemplarily depicted in FIG. 3, the magnetic sensor 2 is a one-chip MI sensor, with a MI element 21 and a drive circuit integrated together. The MI element 21 includes an amorphous wire (an example of a magneto-sensitive body) 211 with approximately zero magnetostriction and made of a CoFeSiB-based alloy, and a pickup coil 213 wound around this amorphous wire 211. The magnetic sensor 2 measures a voltage occurring at the pickup coil 213 when a pulse current is applied to the amorphous wire 211, thereby detecting magnetism acting on the amorphous wire 211 as a magneto-sensitive body.

The drive circuit is an electronic circuit including a pulse circuit 23 which supplies a pulse current to the amorphous wire 211 and a signal processing circuit 25 which samples and outputs a voltage occurring at the pickup coil 213 at a predetermined timing. The pulse circuit 23 includes a pulse generator 231 which generates a pulse signal serving as a source of a pulse current. The signal processing circuit 25 extracts an induced voltage of the pickup coil 213 via a synchronous detector 251 which is opened and closed in conjunction with the pulse signal and amplifies the voltage at a predetermined amplification factor by an amplifier 253. A signal acquired by amplification by this signal processing circuit 25 is outputted to the outside as a sensor signal.

The specification of the magnetic sensor 2 is partially depicted in Table 2.

TABLE 2

| Measurement range | ±0.6 mT |
|---|---|
| Magnetic flux resolution | 0.02 µT |
| Sampling period | 3 kHz |

This magnetic sensor 2 is a highly-sensitive sensor having a measurement range of the magnetic flux density of ±0.6 mT and a magnetic flux resolution in that measurement range of 0.02 µT. This high sensitivity is achieved by the MI element 21 using the MI effect, in which the impedance of the amorphous wire 211 sensitively changes in accordance with the external magnetic field. Furthermore, this magnetic sensor 2 can perform high-speed sampling with a period of 3 kHz, and also supports vehicle's high-speed traveling. In place of sampling with the period of 3 kHz, for example, a magnetic measurement may be performed every time the vehicle moves over a predetermined distance such as 20 mm.

Figure 4:
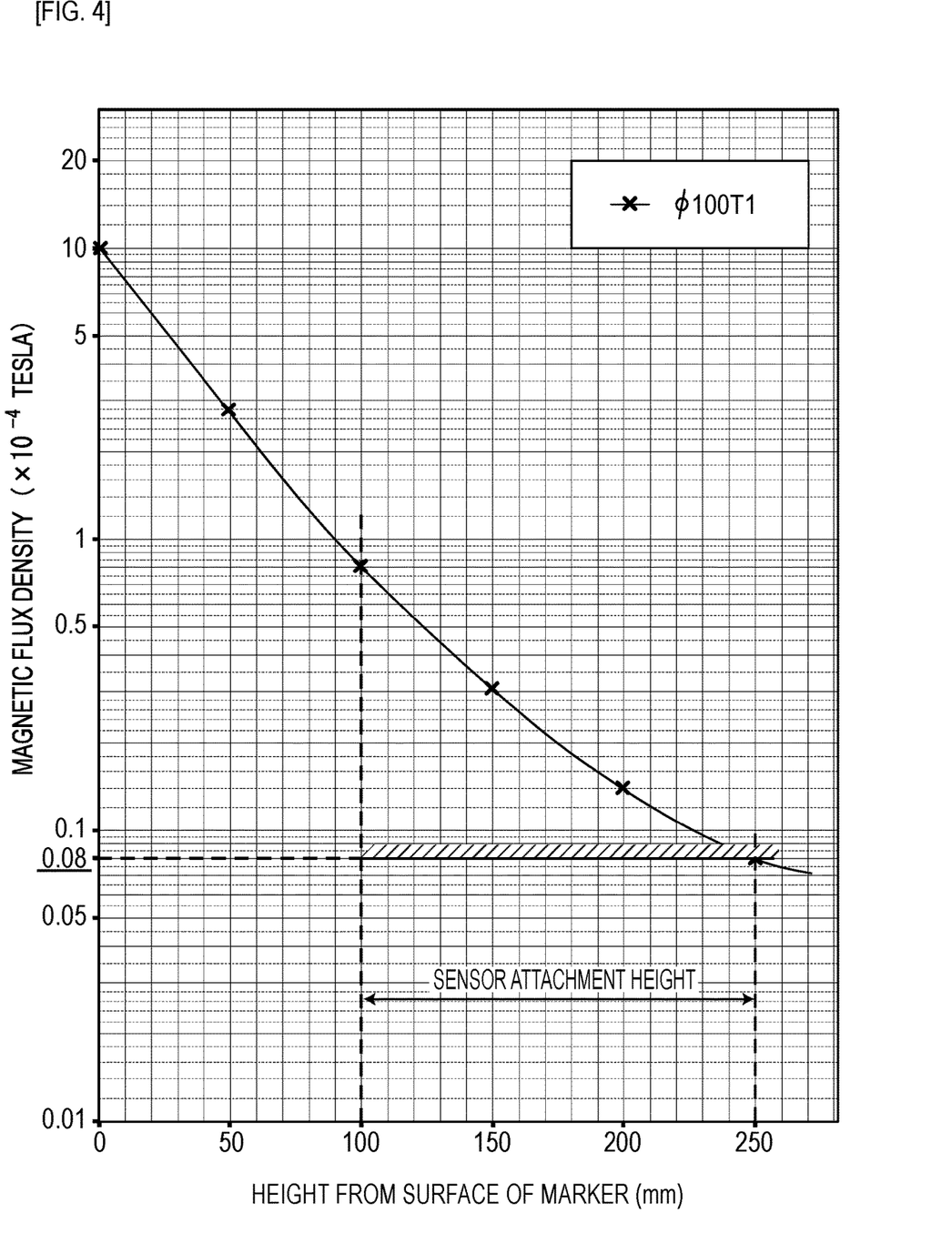
FIG. 4 is a graph depicting a magnetic field distribution of the magnetic marker in a vertical direction in the first embodiment.

Next, the magnetic field distribution of the magnetic marker 1 of the present example in the vertical direction is described with reference to FIG. 4. FIG. 4 is a semilogarithmic graph depicting simulation results by axisymmetric three-dimensional magneto-static analysis using the finite element method. In FIG. 4, a logarithmic scale of the magnetic flux density of magnetism acting in the vertical direction is set on the vertical axis, and the height in the vertical direction with reference to the surface of the magnetic marker 1 (height from the surface of the marker) is set on the horizontal axis. In FIG. 4, the magnetic flux density when the height from the surface of the marker=0 mm is the "magnetic flux density Gs of the surface", and the magnetic flux density when the height from the surface of the marker=250 mm is the "magnetic flux density Gh at a position at a height of 250 mm (the magnetic flux density Gh at a height of 250 mm as appropriate)".

As depicted in FIG. 4, in the magnetic marker 1, the magnetic flux density Gh of magnetism acting at the position at the height of 250 mm is 8 µT. In this magnetic marker 1, the magnetic flux density Gs of the surface is 1 mT (refer to Table 1), and thus the magnetism reach ratio Gh/Gs, which is a ratio of the magnetic flux density Gh at the position at the height of 250 mm with respect to the magnetic flux density Gs of the surface, is 0.8%.

According to the magnetic marker 1 with the magnetism reach ratio Gh/Gs of 0.8% and the magnetic flux density Gs of the surface of 1 mT, in a range of 100 mm to 250 mm assumed as an attachment height of the magnetic sensor 2 (sensor attachment height), magnetism of the magnetic flux density equal to or larger than 8 µT can act. When magnetism having a magnetic flux density of 8 µT acts, the magnetic marker 1 can be reliably detected by using the magnetic sensor 2 having a magnetic flux resolution of 0.02 µT (refer to Table 2).

In the magnetic marker 1 of the present example, by achieving the magnetism reach ratio Gh/Gs of 0.8%, the magnetic flux density Gs of the surface is reduced to 1 mT ($10 \times 10^{-4}$ T) while magnetic characteristics detectable by the magnet sensor 2 are ensured. This magnetic flux density of 1 mT is smaller than one tenth of the magnetic flux density on the order of 20 mT to 40 mT of the surfaces of magnetic sheets to be attached to a whiteboard or the door of a refrigerator, for example. The magnetic marker 1 has a very subtle magnetic force even compared with these magnetic sheets for office or home use. Thus, if this magnetic marker 1 is laid on the road surface 53, a fear of attracting a metallic substance such as a nail or bolt is very low.

As described above, the magnetic marker 1 of the present example is a road marker with excellent characteristics having a reduced magnetic force. In the magnetic marker detection system is including this magnetic marker 1, the magnetic sensor 2 using the MI element 21 is adopted to allow detection of subtle magnetism acting from the magnetic marker 1.

Next, the reason why the diameter of 100 mm is selected for the magnetic marker 1 is described with reference to computer simulation results of FIG. 5 and FIG. 6.

Figure 5:
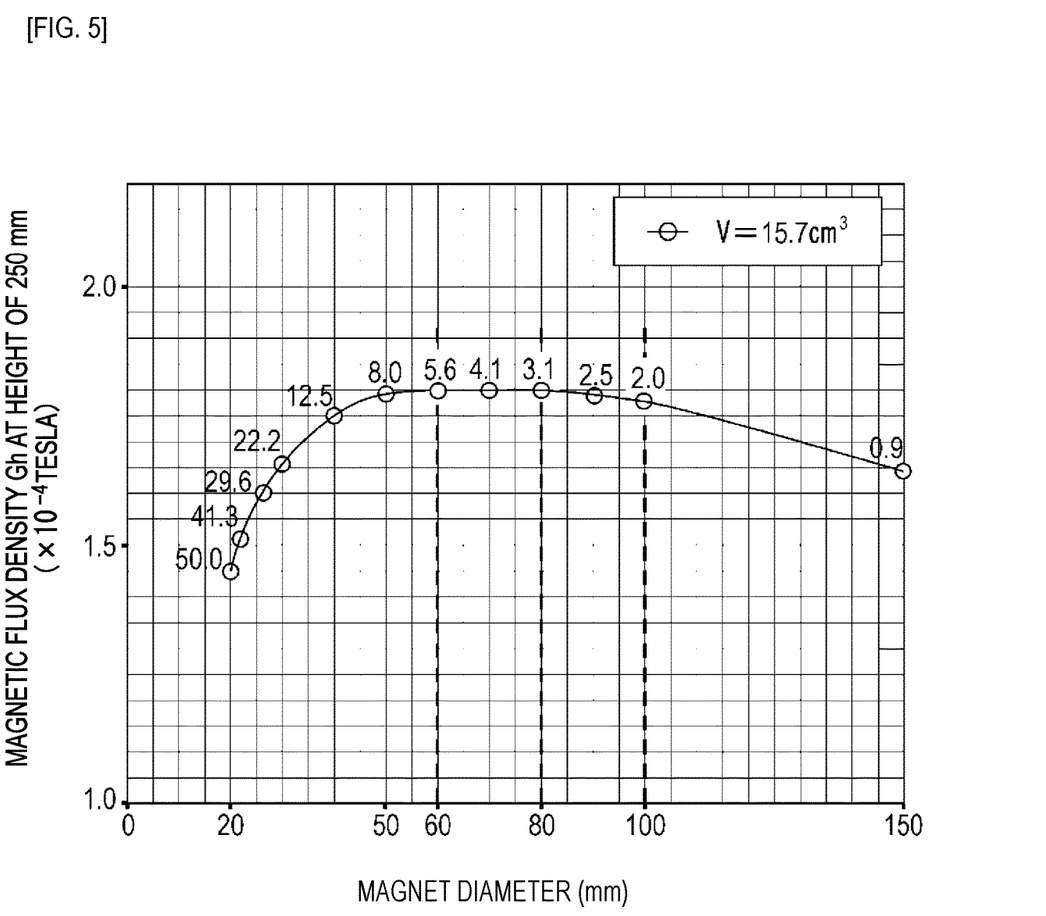
FIG. 5 is a graph exemplarily depicting a relation between the diameter of a magnet and a magnetic flux density $Gh$ at a position at a height of 250 mm in the first embodiment.

A graph in FIG. 5 depicts changes in the magnetic flux density Gh at the height of 250 mm when a columnar magnet having a diameter of 20 mm and a height of 50 mm is taken as a reference, the volume is set as constant (volume=15.7 $cm^3$), but the diameter and the height are changed. FIG. 5 is a graph with the diameter of the magnet taken as the horizontal axis and the magnetic flux density Gh at the height of 250 mm taken as the vertical axis. In FIG. 5, simulation results are depicted by plotting circles, which are accompanied with heights (mm) of the magnet. The simulation in FIG. 5 is a reference simulation of a neodymium magnet having a remanence (residual magnetic flux density) of 1.19 T. It has been confirmed through a computer simulation, demonstrative experiment, and so forth that an isotropic rubber magnet configuring the magnetic marker 1 of the present example has a similar qualitative tendency.

In the graph of FIG. 5, a plot at the left end represents data of a magnet having a diameter of 20 mm×a height of 50 mm serving as a reference. With reference to this plot at the left end, it can be found that the magnetic flux density Gh is improved as the diameter is increased in a diameter range of 20 mm to 60 mm. The magnetic flux density Gh becomes close to a maximum value in a diameter range of 60 mm to 80 mm, and is decreased as the diameter is increased in a diameter range exceeding 80 mm. However, in a diameter range of 80 mm to 100 mm, a rate of variability of the magnetic flux density Gh with respect to the diameter is small, and the decrease of the magnetic flux density Gh is subtle.

To ensure the magnetic flux density Gh required at the position at the height of 250 mm, in view of material cost, that is, the amount of use of a magnetic material required to mold a magnet, the most favorable material cost efficiency can be achieved with a magnet having a diameter of 60 mm to 80 mm. On the other hand, in a diameter range smaller than 60 mm and exceeding 80 mm, the material cost efficiency tends to slightly decrease. However, the possibility of keeping sufficiently high material cost efficiency is high in a diameter range of 80 mm to 100 mm with a low degree of decrease of the magnetic flux density Gh.

Figure 6:
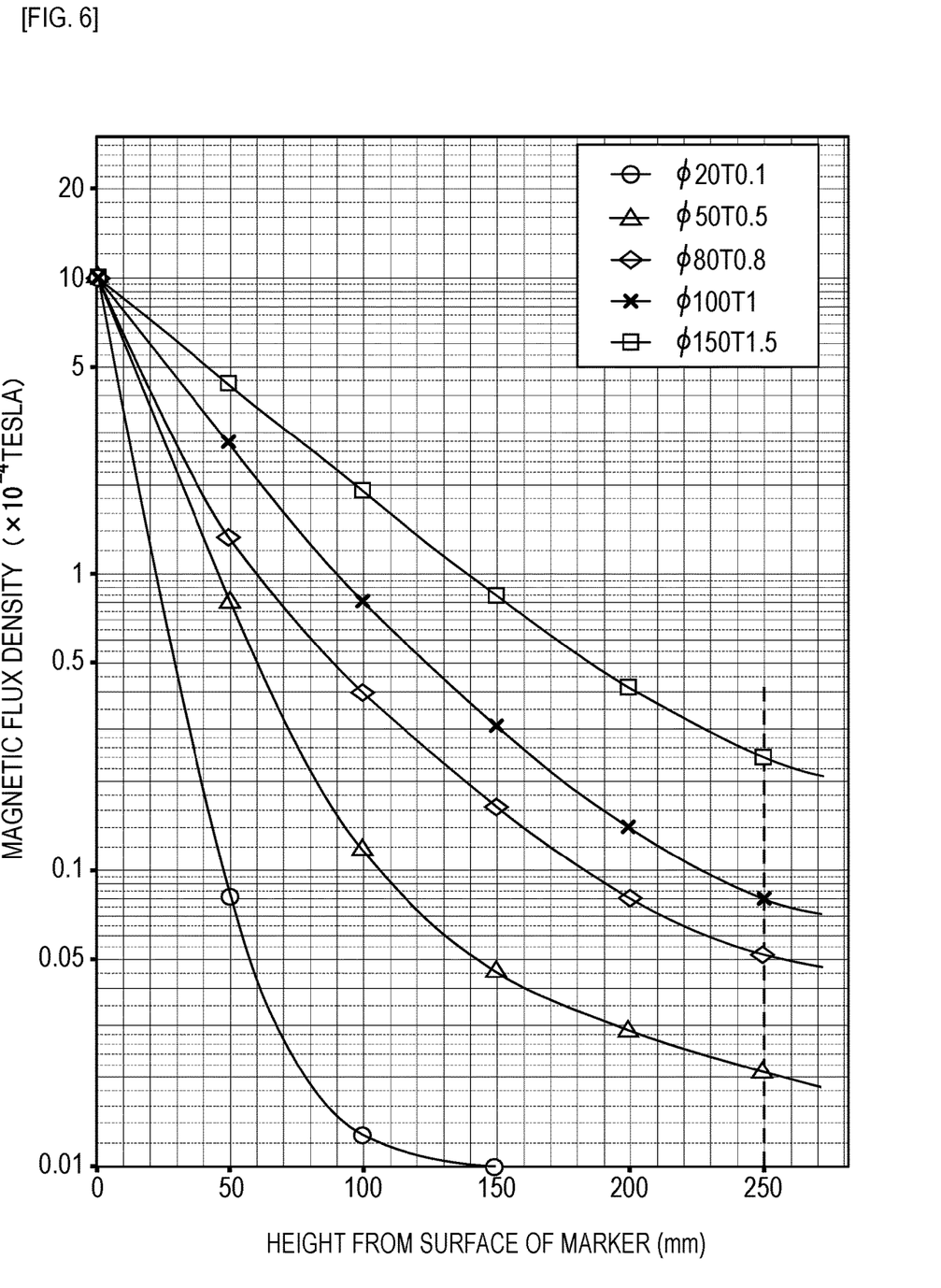
FIG. 6 is a graph depicting a magnetic field distribution of the magnetic marker in the vertical direction in the first embodiment.

A graph in FIG. 6 depicts a simulation of a magnetic field distribution in the vertical direction for magnetic markers of various sizes having the magnetic flux density Gs of the surface of 1 mT. FIG. 6 depicts the results of the computer simulation for magnetic markers each formed of a isotropic rubber magnet having a maximum energy product (BHmax) =6.4 $kJ/m^3$, as with the magnetic marker 1 of the present example.

This simulation is targeted for magnetic markers having diameters of five types from 20 mm to 150 mm including 100 mm. In this simulation, the thickness is changed so that the magnetic flux density Gs of the surface is 1 mT irrespectively of the difference in diameter. For example, ϕ 100 T 1 in legends represents a magnetic marker having a diameter of 100 mm and a thickness of 1 mm. Note herein that the thickness of the resin mold is ignored and the size of the magnetic marker=the size of the magnet.

The graph in FIG. 6 is a semilogarithmic graph with graph axes similar to those of FIG. 4. According to FIG. 6, it can be found that the magnetic marker having a larger diameter has a higher magnetic flux density Gh at the height of 250 mm with respect to the magnetic flux density Gs of the surface and attenuation of the magnetic flux density in the vertical direction is reduced. For example, by way of comparison as to the magnetic flux density Gh at the height of 250 mm, the magnetic flux density Gh of a magnet having a diameter of 50 mm and a thickness 0.5 mm is 2 μT, while the magnetic flux density Gh of a magnet having a diameter of 100 mm and a thickness of 1 mm is 8 μT. In this manner, as the diameter of the magnetic marker is increased, the magnetism reach ratio (Gh/Gs) tends to increase, which is a ratio of the magnetic flux density Gh at the height of 250 mm with respect to the magnetic flux density Gs of the surface.

When the magnetic flux density Gh required for detection by the magnetic sensor 2 is defined, as the above-described magnetism reach ratio (Gh/Gs) is higher, the magnetic flux density Gs of the surface of the magnetic marker can be more reduced. As the magnetic flux density Gs of the surface is decreased, an effect is produced in which the range of selection of a magnetic material, diameter, thickness, shape, and so forth is widened to improve design flexibility of the magnetic marker.

Thus, in the present example, the diameter of the magnetic marker 1 is set at 100 mm largely on the basis of the following findings based on simulation results depicted in FIG. 5 and FIG. 6.

(1) The most favorable material cost efficiency can be achieved in the diameter range of 60 mm to 80 mm, and sufficiently high material cost efficiency can be kept in the diameter range of 80 mm to 100 mm.

(2) The magnetism reach ratio (Gh/Gs), which is a ratio of the magnetic flux density Gh at the height of 250 mm with respect to the magnetic flux density Gs of the surface, is improved as the diameter of the magnet (magnetic marker) is increased.

In place of the circular shape in the present example, the magnetic marker may have a polygonal shape such as a triangular, quadrangular, or hexagonal shape, may have a rectangular shape, or may have a cross shape with two rectangles crossing.

Methods for laying on the road surface may include a method of adhesive joint by using an adhesive agent or the like and a method of fixing by using a fixing pin in a nail-like shape. Furthermore, a method may be adopted in which a magnetic material before magnetization is laminated or applied in advance to a front surface side of a road surface and a predetermined range is magnetized, thereby forming a magnetic marker equivalent to that of the present example. Another exemplary method may be adopted in which a line applied with a coating containing a magnetic material is printed along the center of a lane and then a predetermined position on the line is magnetized.

When a magnetic sensor using a highly-directive MI element is adopted, one MI element is preferably provided for each direction of magnetism detection. If only magnetic components in the vertical direction are detected, one MI element is enough. However, it is preferable to provide MI elements so as to respectively correspond to three-dimensional directions. If one MI element is provided for each of the three-dimensional directions, magnetic components generated from the magnetic marker can be three-dimensionally detected. It is also preferable, for example, to provide a MI element for detecting magnetism in the vertical direction of the road surface, a MI element for detecting magnetism in a vehicle's traveling direction, and a MI element for detecting magnetism in a lateral direction (vehicle width direction) of the vehicle. When magnetism in the vehicle's traveling direction is detected, for example, with a detection of an inversion of positive and negative poles in a magnetic direction, the position of the magnetic marker in the vehicle's traveling direction can be accurately measured.

If a plurality of MI elements are provided, a pulse circuit and a signal processing circuit may not be individually provided for each MI element, but may be shared for use in a time-division manner. If these circuits can be shared for use, a reduction in size and cost of the magnetic sensor can be easily achieved.

A plurality of magnetic sensors may be disposed along the lateral direction of the vehicle. With a detection of a peak in a magnetic distribution detected by each magnetic sensor, a relative position of each magnetic marker in the lateral direction may be determined.

While the MI sensor using an MI element has been exemplarily described as a magnetic sensor, a fluxgate sensor or TMR sensor can be adopted in place of the above-described MI sensor. If two or more magnetic sensors are used, two or more types among the MI sensor, the fluxgate sensor, and the TMR sensor can be adopted in combination.

The type of the magnetic material or magnet of the magnetic sheet configuring the magnetic marker is not limited to that of the present example. Any of various materials and types can be adopted as the type of the magnetic material or magnet. Any appropriate magnetic material and type is selectively determined in accordance with the magnetic specification, environmental specification, and so forth required for the magnetic marker.

In the present example, the specification of the magnetic marker is selectively determined by using the computer simulation results. For use of a computer simulation, simulation accuracy is confirmed in advance through a demonstrative experiment under part of simulation conditions. Also, as for the magnetic marker 1, it has been confirmed through a demonstrative experiment that magnetic characteristics close to the computer simulation results can be achieved.

Second Embodiment

A second embodiment is an example in which a relation between the diameter of the magnet and the magnetism reach ratio Gh/Gs is studied based on the first embodiment. The second embodiment is described with reference to FIG. 7 to FIG. 9.

Figure 7:
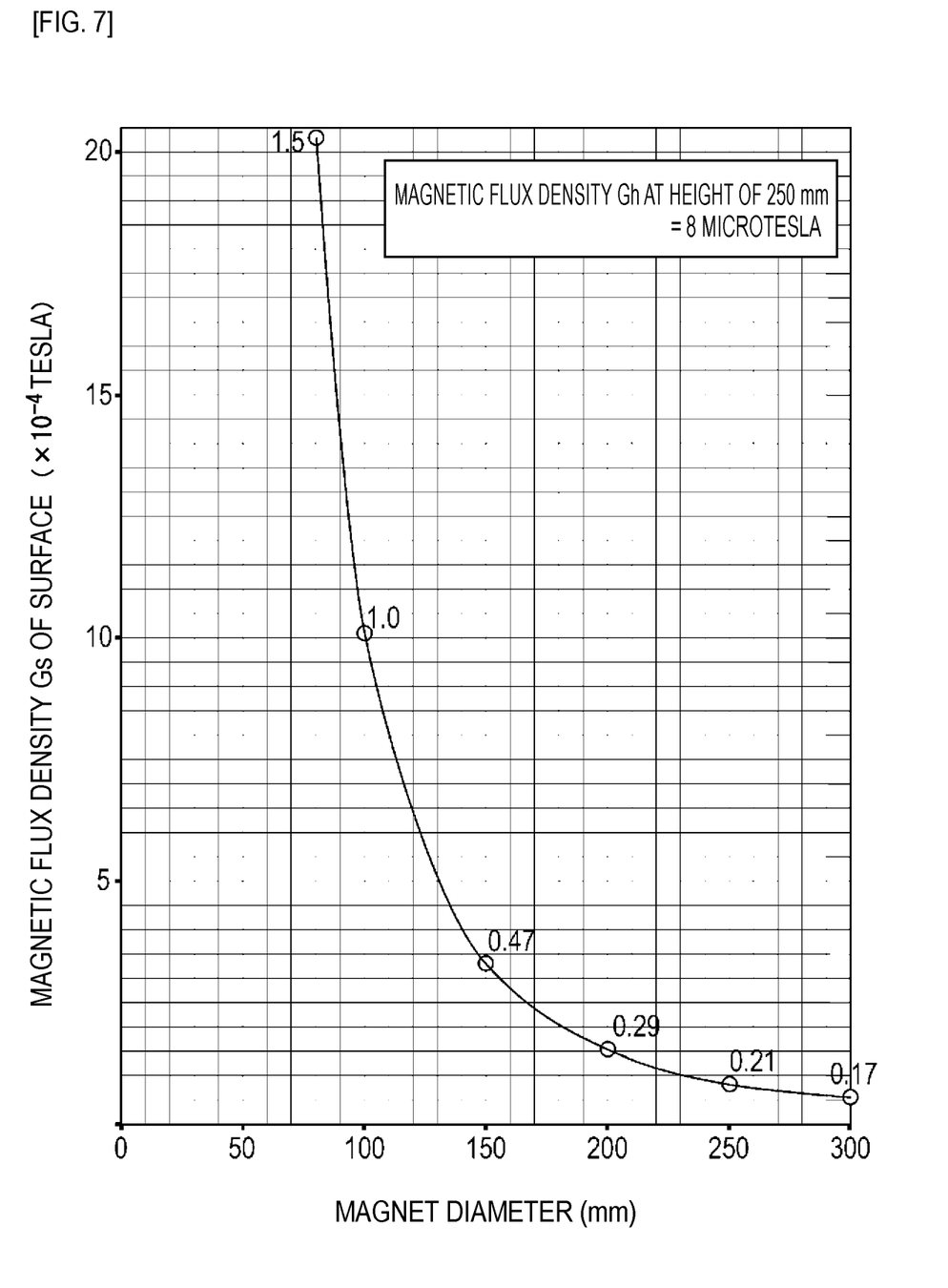
FIG. 7 is a graph depicting a relation between the diameter of the magnet and a magnetic flux density $Gs$ in a second embodiment

FIG. 7 depicts simulation results indicating a relation between the diameter and the magnetic flux density Gs of the surface of a magnet which acts magnetism with the magnetic flux density Gh=8 μT at the position at the height of 250 mm. In FIG. 7, the horizontal axis represents the diameter of the magnet, and the vertical axis represents the magnetic flux density Gs of the surface. Circles are plotted, which are accompanied with thicknesses (heights, mm) of the magnet which achieves the magnetic flux density Gh=8 μT.

Figure 8:
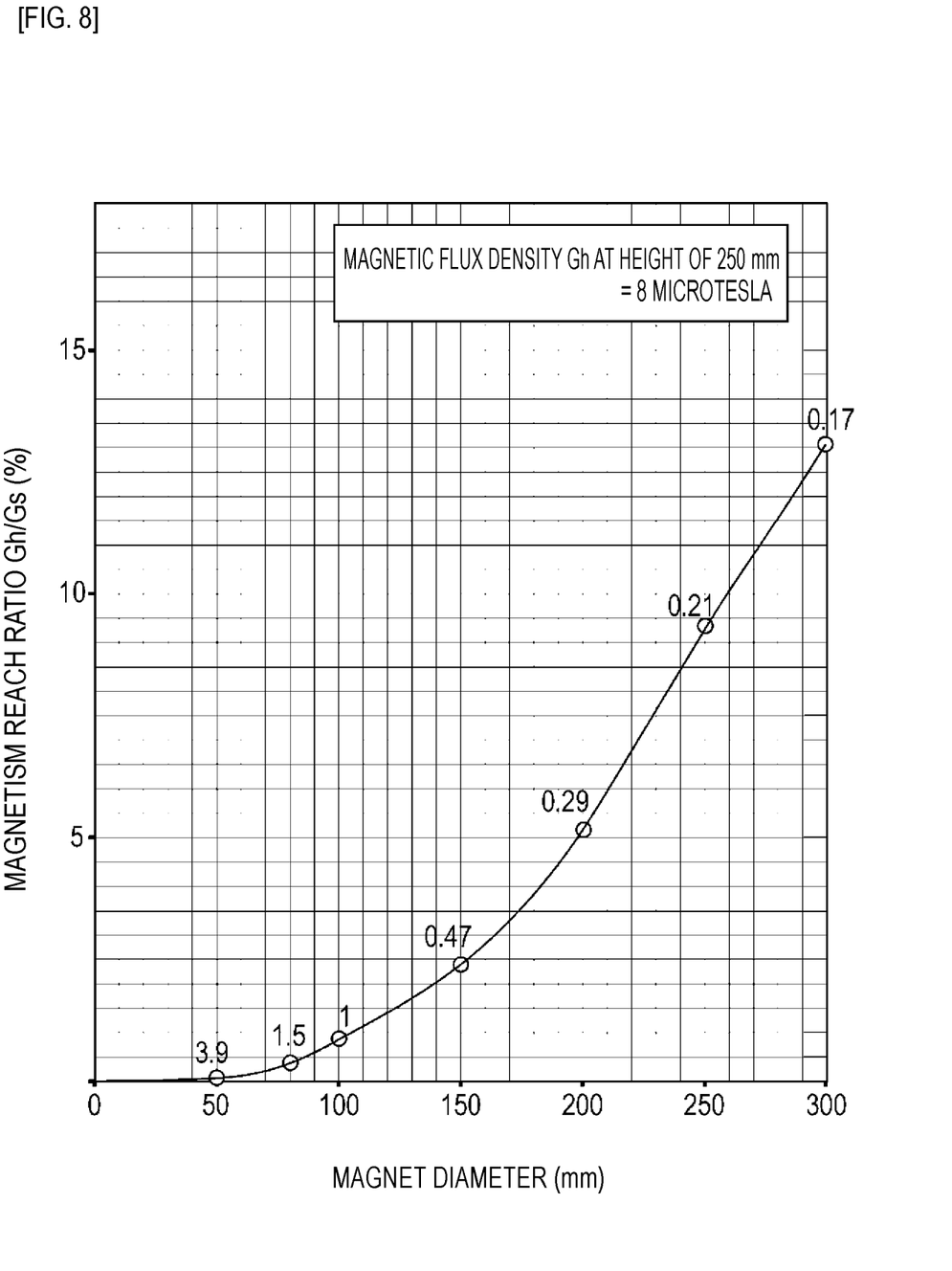
FIG. 8 is a graph depicting a relation between the diameter of the magnet and a magnetism reach ratio $Gh/Gs$ in the second embodiment.

FIG. 8 is a graph depicting a relation between the diameter of the magnet and the magnetism reach ratio Gh/Gs. In the graph of FIG. 8, simulation data configuring the graph of FIG. 7 are processed to change a display format.

According to FIG. 7, it is found that the magnetic flux density Gs of the surface required to achieve the magnetic flux density Gh=8 µT at the height of 250 mm increases in a diameter range equal to or smaller than 80 mm. On the other hand, when the diameter exceeds 80 mm, the above-mentioned magnetic flux density Gs of the surface abruptly decreases to approximately 2 mT or smaller. When the diameter exceeds 200 mm, the degree of decrease is reduced to gradually become closer to be constant. The magnetic flux density Gs of the surface required to achieve the magnetic flux density Gh=8 µT at the height of 250 mm can be reduced to be approximately equal to or smaller than 1 mT when the diameter exceeds 100 mm, and further decreases as the diameter is closer toward 150 mm.

According to FIG. 8 depicting degrees of changes of the magnetism reach ratio Gh/Gs with respect to the diameter, it can be found that the correlation of the magnetism reach ratio Gh/Gs with respect to the diameter is high, that is, the magnetism reach ratio Gh/Gs tends to be larger as the diameter is larger. Furthermore, as the diameter is larger, the gradient of the graph depicting the change ratio of the magnetism reach ratio Gh/Gs with respect to the diameter is larger. In particular, this change ratio greatly changes in a diameter range of 100 mm to 200 mm. This diameter range of 100 mm to 200 mm in which the change ratio greatly changes corresponds to a range in FIG. 7 in which the magnetic flux density Gs of the surface required to achieve the magnetic flux density Gh=8 µT at the height of 250 mm abruptly decreases.

Figure 9:
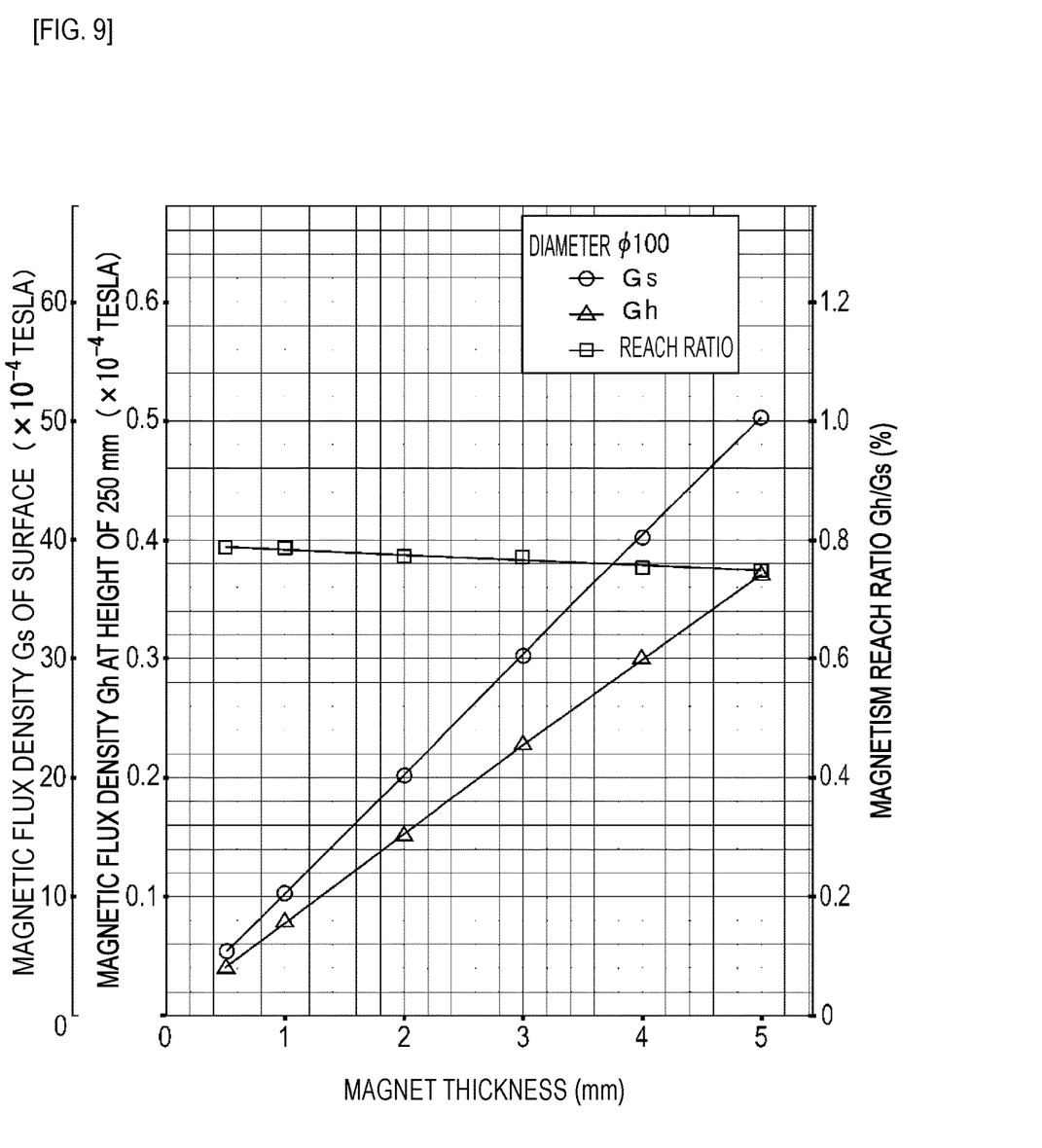
FIG. 9 is a graph depicting a relation between the thickness of the magnet and the magnetism reach ratio $Gh/Gs$ in the second embodiment.

FIG. 9 depicts simulation results of studying the degree of dependency as to whether the magnetism reach ratio Gh/Gs changes depending on the thickness (mm) of the magnet. In this simulation, with reference to a magnet in a flat shape having a diameter of 100 mm and a thickness of 1 mm, changes of the magnetism reach ratio Gh/Gs when the thickness is changed were studied. In FIG. 9, the horizontal axis represents the thickness of the magnet, and three vertical axes are set, representing the magnetic flux density Gs of the surface, the magnetic flux density Gh at the height of 250 mm, and the magnetism reach ratio Gh/Gs. Numerical values on the vertical axes are represented by plotting circles for the magnetic flux density Gs of the surface, plotting triangles for the magnetic flux density Gh, and plotting squares for the magnetism reach ratio Gh/Gs.

As depicted in the graph of FIG. 9, simulation results were acquired such that when the diameter of the magnet is set constant at 100 mm, the magnetic flux density Gs of the surface and the magnetic flux density Gh at the height of 250 mm both approximately linearly change with respect to the thickness. With the magnetic flux density Gs of the surface and the magnetic flux density Gh at the height of 250 mm both linearly changing, the magnetism reach ratio Gh/Gs is approximately constant. In this manner, the magnetism reach ratio Gh/Gs is approximately constant irrespectively of the thickness and the magnetic flux density of the magnet. From this, it can be found that the tendency acquired in FIG. 7 and FIG. 8 is a common tendency for various flat-shaped magnetic markers of different magnetic specifications.

The simulation results of FIG. 7 to FIG. 9 are those all regarding the flat-shaped magnet with a small dimension in a height (thickness) direction with respect to the diameter. According to these simulation results, the following tendency can be acquired for the flat-shaped magnet. That is, while the magnetism reach ratio Gh/Gs does not change much if the thickness of the magnet is changed, the magnetism reach ratio Gh/Gs depends on the diameter of the magnet, that is, the larger the diameter of the magnet is, the larger the magnetism reach ratio Gh/Gs is. Therefore, it can be found that, to reduce the magnetic flux density Gs of the surface while ensuring the magnetic flux density Gh of magnetism acting on the magneticسsensor, the diameter of the magnet is increased to increase the magnetism reach ratio Gh/Gs.

In particular, if the magnetism reach ratio Gh/Gs is in a range equal to or larger than 0.5%, for example, the magnetic flux density Gs of the surface can be reduced to 1.6 mT or smaller with respect to the magnetic flux density Gh=8 µT at the height of 250 mm. While the magnetic flux density Gh=8 µT is a magnetic intensity that can be detected with leeway by using a MI element having a magnetic flux resolution of 0.02 µT, the magnetic flux density Gs of the surface=1.6 mT is a subtle magnetism lower than 1/10 of the magnetic flux density of magnet sheets for office and business use. Furthermore, if the magnetism reach ratio Gh/Gs is equal to or larger than 1%, the magnetic flux density Gs of the surface can be reduced within 0.8 mT.

In the case of a MI element capable of detecting a magnetic flux density of 0.5 µT, if the magnetism reach ratio Gh/Gs of the magnetic marker is equal to or larger than 0.5%, the magnetic flux density Gs of the surface can be reduced as low as 0.1 mT (0.5 µT/0.5%). If the sensitivity of the MI element is enhanced, a magnetic flux density smaller than 0.5 µT can also be detected. However, since the cost and size of the magnetic sensor may be increased to enhance sensitivity, the magnetic flux density Gh at the position at the height of 250 mm is set equal to or larger than 0.5 µT. Preferably, the magnetic flux density Gh is equal to or larger than 1 µT.

To achieve the magnetism reach ratio Gh/Gs equal to or larger than 0.5%, the diameter of the magnetic marker is set, for example, equal to or larger than 90 mm. More preferably, to achieve the magnetism reach ratio Gh/Gs equal to or larger than 1%, the diameter of the magnetic marker is set equal to or larger than 110 mm. In particular, if the diameter of the magnetic marker is set at 120 mm to 150 mm, the magnetism reach ratio Gh/Gs is further increased, and the effect of reducing the magnetic flux density Gs of the surface is enhanced.

In general, magnetic lines of force generated from a pole face of a magnet go through a route, which has a loop shape at an outer edge of the pole face, to a pole face on an opposite side, and are tilted more with respect to the vertical direction of the pole face and, on the other hand, the magnetic lines of force tend to be more analogous to a straight line in the vertical direction of the pole face as being nearer to the center away from the outer edge. Thus, as a longer distance is ensured for the magnet from the outer edge of the pole face to the center, stronger magnetism tends to act in the vertical direction of the pole face to increase the magnetism reach ratio Gh/Gs. If the area is constant, a circular shape where the distance from the outer edge to the center is constant is the most advantageous shape for ensuring the magnetism reach ratio Gh/Gs. When the magnetic marker has a polygonal shape, a shape with a more number of vertexes and closer to a circular shape is more advantageous. Also, for example, when the magnet marker has a quadrangular shape, if the shape is closer to a square with a small difference in length between a long side and a short side, a difference in distance between the center of the pole face and each side is reduced to increase a minimum value, and thus this is advantageous to ensure the magnetism reach ratio Gh/Gs. For example, when the magnetic marker has a triangular shape, similarly, an equilateral triangle shape is advantageous. Furthermore, when the magnetism reach ratio Gh/Gs of the magnetic marker in an equilateral triangle shape is desired to be further increased, the size of the triangle is increased. When the size has a limitation, each side of the equilateral triangle is swelled to the outside in a curved convex shape, such as a rotor shape of a rotary engine. This allows an increase in the distance between the center of the pole face and each side, and thus is effective to improve the magnetism reach ratio Gh/Gs.

The large magnetism reach ratio Gh/Gs is effective in detection by not only the MI element described above but also the fluxgate sensor and the TMR sensor, as well as a low-sensitivity Hall element. This is because the magnetic flux density Gs of the surface of the magnetic marker can be reduced with respect to the magnetic flux density Gh required for detection, and the magnetic force of the magnetic marker can be decreased. The reduction in the magnetic force of the magnetic marker can decrease the fear of attracting a metallic substance such as a nail or bolt falling on the road surface, for example. When the magnetic sensor has low sensitivity such as a Hall element, the diameter of the magnetic marker is increased so that the magnetism reach ratio Gh/Gs is equal to or larger than 1% or 2%. For example, if the diameter of the magnetic marker is set at 150 mm to 200 mm, the magnetism reach ratio Gh/Gs can be improved to 2.4% to 5.2%, and the effect of reduction of the magnetic flux density Gs of the surface can be enhanced.

The diameter of the magnetic marker may be equal to or larger than 80 mm. With the diameter being 80 mm, even if the magnetic flux density Gs of the surface is reduced to 1 mT, the magnetic flux density Gh at the position at the height of 250 mm is 5 µT. With the magnetic flux density being 5 µT, detection can be sufficiently performed by using the magnetic marker 1 having a magnetic flux resolution of 0.02 µT (refer to Table 2). The magnetic marker may have a diameter smaller than 80 mm, but the sensitivity of the magnetic sensor has to be enhanced to support a smaller magnetic flux density, thereby possibly increasing cost.

On the other hand, if the diameter of the magnetic marker 1 is too large, it is difficult to distinguish the magnetic marker from a magnetic source such as an iron-made lid of a manhole, for example. The size of the magnetic marker is selectively set in consideration of the type, size, magnetic field intensity, and so forth of a magnetism generation source that is present on the road where the magnetic marker is to be laid.

While the specific examples of the present invention have been described above in detail as in the above embodiment, these specific examples merely describe examples of technologies included in the claims. Needless to say, the claims should not be restrictively construed by the structures, numerical values, and so forth of the specific examples. The claims include technologies obtained by variously modifying, changing, and combining the specific examples as appropriate by using known technologies, knowledge, and so forth by people skilled in the art.

DESCRIPTION OF SYMBOLS 1 magnetic marker
1S magnetic marker detection system
11 flat magnetic sheet
12 resin mold
2 magnetic sensor
21 MI element
211 amorphous wire (magneto-sensitive body)
213 pickup coil
5 vehicle
50 vehicle's body floor (bottom surface)
53 road surface

What is claimed is:

1. A magnetic marker, wherein
the magnetic marker is configured to be detectable by a magnetic sensor attached to a bottom surface side of a vehicle to achieve driving support control on a vehicle side for supporting driving of a driver when the magnetic marker is laid on a road surface,
the magnetic marker has a diameter equal to or larger than 80 mm,
the magnetic marker has a magnet, and
the magnet has a surface taken as a reference height, and a magnetism reach ratio Gh/Gs, which is a ratio of a magnetic flux density Gh at a position at a height of 250 mm with respect to a magnetic flux density Gs at a position at a height of 0 mm, is equal to or larger than 0.5%.

2. The magnetic marker according to claim 1, wherein the magnetic flux density Gh is equal to or larger than 0.5 µT and equal to or smaller than 20 µT (equal to or larger than 5 mG and equal to or smaller than 200 mG).

3. The magnetic marker according to claim 2, wherein the magnetism read ratio Gh/Gs is equal to or larger than 1.0%.

4. A magnetic marker detection system in which magnetism generated from a magnetic marker laid on a road surface is detected by a magnetic sensor attached to a bottom surface of a vehicle to achieve driving support control of the vehicle, wherein
the magnetic marker is the magnetic marker according to claim 3.

5. The magnetic marker according to claim 3, wherein a coating or a resin mold having a waterproof and wear-resistant effect is applied to the surface.

6. The magnetic marker according to claim 3, wherein the magnetic marker has a thickness within 5 mm and can be laid on the road surface without boring a recessed accommodation hole.

7. A magnetic marker detection system in which magnetism generated from a magnetic marker laid on a road surface is detected by a magnetic sensor attached to a bottom surface of a vehicle to achieve driving support control of the vehicle, wherein
the magnetic marker is the magnetic marker according to claim 2.

8. The magnet marker according to claim 2, wherein the magnetic marker has a circular shape and the diameter equal is equal to or smaller than 100 mm.

9. The magnetic marker according to claim 2, wherein a coating or a resin mold having a waterproof and wear-resistant effect is applied to the surface.

10. The magnetic marker according to claim 2, wherein the magnetic marker has a thickness within 5 mm and can be laid on the road surface without boring a recessed accommodation hole.

11. The magnetic marker according to claim 1, wherein the magnetism reach ratio Gh/Gs is equal to or larger than 1.0%.

12. A magnetic marker detection system in which magnetism generated from a magnetic marker laid on a road surface is detected by a magnetic sensor attached to a bottom surface of a vehicle to achieve driving support control of the vehicle, wherein
the magnetic marker is the magnetic marker according to claim 11.

13. The magnetic marker according to claim 11, wherein a coating or a resin mold having a waterproof and wear-resistant effect is applied to the surface.

14. The magnetic marker according to claim 11, wherein the magnetic marker has a thickness within 5 mm and can be laid on the road surface without boring a recessed accommodation hole.

15. The magnetic marker according to claim 1, wherein a coating or a resin mold having a waterproof and wear-resistant effect is applied to the surface.

16. The magnetic marker according to claim 15, wherein the magnetic marker has a thickness within 5 mm and can be laid on the road surface without boring a recessed accommodation hole.

17. The magnetic marker according to claim 1, wherein the magnetic marker has a thickness within 5 mm and can be laid on the road surface without boring a recessed accommodation hole.

18. A magnetic marker detection system in which magnetism generated from a magnetic marker laid on a road surface is detected by a magnetic sensor attached to a bottom surface of a vehicle to achieve driving support control of the vehicle, wherein
the magnetic marker is the magnetic marker according to claim 1.

19. The magnetic marker detection system according to claim 18, wherein
as the magnetic sensor, at least one type among a magneto-impedance sensor, a fluxgate sensor, and a Tunneling Magento Resistive sensor is used.

20. The magnet marker according to claim 1, wherein the magnetic marker has a circular shape and the diameter equal is equal to or smaller than 100 mm.

* * * * *